(12) United States Patent
Donnangelo

(10) Patent No.: US 11,404,861 B2
(45) Date of Patent: Aug. 2, 2022

(54) SYSTEM AND METHODS FOR MITIGATING GROUND INDUCED CURRENTS ON COMMERCIAL POWER INFRASTRUCTURE

(71) Applicant: The MITRE Corporation, McLean, VA (US)

(72) Inventor: Nick Donnangelo, Purcellville, VA (US)

(73) Assignee: The MITRE Corporation, McLean, VA (US)

( * ) Notice: Subject to any disclaimer, the term of this patent is extended or adjusted under 35 U.S.C. 154(b) by 110 days.

(21) Appl. No.: 17/006,386

(22) Filed: Aug. 28, 2020

(65) Prior Publication Data

US 2022/0069563 A1 Mar. 3, 2022

(51) Int. Cl.
*G01R 31/52* (2020.01)
*G01R 31/58* (2020.01)
(Continued)

(52) U.S. Cl.
CPC ............. *H02H 3/162* (2013.01); *G01R 31/52* (2020.01); *H02H 3/021* (2013.01); *H02H 3/06* (2013.01)

(58) Field of Classification Search
CPC ........ G01R 31/52; G01R 31/58; G01R 19/00; H02H 3/021–023
See application file for complete search history.

(56) References Cited

U.S. PATENT DOCUMENTS 5,038,245 A * 8/1991 Gronskog ................ H02H 9/04
361/111

5,436,786 A * 7/1995 Pelly ...................... H02H 9/041
361/91.8

(Continued)

FOREIGN PATENT DOCUMENTS

WO 2015/070345 A1 5/2015

OTHER PUBLICATIONS

Persons et al. (2018) "Technology Assessment, Critical Infrastructure Protection: Protecting the Electric Grid from Geomagnetic Disturbances," United States Government Accountability Office Report to the Committee on Homeland Security and Governmental Affairs, United States Senate; 55 pages.

*Primary Examiner* — Sisay G Tiku
(74) *Attorney, Agent, or Firm* — Morrison & Foerster LLP

(57) ABSTRACT

Systems and methods for mitigating ground induced currents are provided. In one or more examples, the systems and methods can utilize one or more device(s) that can be configured to detect DC currents being induced in and propagated along a power line that is transmitting an AC power signal. In one or more examples the device can be separate the desirable AC power waveform from the undesirable induced DC voltage and determine if the level of induced DC propagating on the power line requires mitigation. In one or more examples, if it is determined that mitigation is required, then the device can be configured to trigger a switch that can be shunt the DC power at the AC waveform zero crossing to a circuit element that is configured to dissipate the undesirable DC current. Filtering can be employed to remove any inadvertent low voltage harmonic distortion. The switch can be triggered during a zero-crossing of the signal to minimize disruption to an end user of the power signal.

30 Claims, 5 Drawing Sheets

(51) Int. Cl.
*H02H 3/02* (2006.01)
*H02H 3/16* (2006.01)
*H02H 3/06* (2006.01)

(56) References Cited

U.S. PATENT DOCUMENTS

| | | | |
|---|---|---|---|
| 5,751,530 | A | 5/1998 | Pelly et al. |
| 9,217,762 | B2 | 12/2015 | Kriekebaum et al. |
| 9,396,866 | B2 | 7/2016 | Ramirez |
| 9,891,289 | B2* | 2/2018 | Kojovic ............... G01R 19/10 |
| 10,243,346 | B2 | 3/2019 | Ali |
| 10,423,181 | B2* | 9/2019 | Dasgupta ................. H02J 3/24 |
| 2012/0019962 | A1* | 1/2012 | Faxvog ............... H02H 7/0455 |
| | | | 327/551 |
| 2012/0087165 | A1* | 4/2012 | Esram ..................... H02J 3/44 |
| | | | 363/97 |
| 2015/0226772 | A1* | 8/2015 | Kreikebaum ........ G01R 15/207 |
| | | | 324/244 |
| 2016/0069935 | A1* | 3/2016 | Kreikebaum ...... G01R 19/0092 |
| | | | 324/117 H |
| 2017/0170648 | A1* | 6/2017 | Hamberger ............ H01F 27/38 |
| 2017/0328935 | A1* | 11/2017 | Kreikebaum .......... G01R 21/08 |
| 2018/0145504 | A1* | 5/2018 | Kovan ................... H01F 27/34 |
| 2020/0049743 | A1* | 2/2020 | Keister ................ G01R 21/133 |
| 2022/0037084 | A1* | 2/2022 | Rezaei Zare .......... H01F 27/34 |

* cited by examiner

SYSTEM AND METHODS FOR MITIGATING GROUND INDUCED CURRENTS ON COMMERCIAL POWER INFRASTRUCTURE

FIELD OF THE DISCLOSURE

This disclosure relates to systems and methods for mitigating ground induced currents so as to protect and improve the reliability of an electric power distribution system or other infrastructure that can be susceptible to faults engendered by geomagnetic events.

BACKGROUND OF THE DISCLOSURE

Electrical power grids are a critical piece of infrastructure that are used to ensure that businesses and individuals receive the electricity they require to conduct their daily lives. Electrical grids transfer electricity that is generated at a power plant and supply that electricity to end users such as businesses or residences to power electrical and electronic systems that are the foundation of modern society. When a problem arises with an electric grid such that the grid is no longer able to distribute the electricity to the end-users, the human, economic and societal consequences can be severe.

This is especially true when the damage to an electrical grid occurs "upstream" such that a large number of end-users are without power. A catastrophic fault in an electrical transmission grid that effects a large number of users can multiply the economic impact of such a fault. As an example, if a catastrophic fault occurs at a transmission substation the impact may be felt by potentially millions of users, and if the fault is such that it cannot be quickly fixed, then the severe impact may be felt for an extended period of time. Between the generating station and consumer, electric power may flow through several substations. A substation, in one or more examples, can generally include transformers, switching, protection, and control equipment. In a large substation, circuit breakers can be used to interrupt any short circuits or overload currents that may occur on the network. Smaller distribution stations may use recloser circuit breakers or fuses for protection of distribution circuits. Other devices such as capacitors, voltage regulators, and reactors to help stabilize the power system, may also be located at a substation.

A transformer can refer to a passive electrical device at each of the three phases that is configured to change voltage levels between high transmission voltages and lower distribution voltages, or to otherwise normalize the voltage at the interconnection of two different transmission grids. A time varying current in any one coil of the transformer can produce a varying magnetic flux, which in turn, can induce a varying electromotive force across any other coils wound around the same core. Electrical energy can be transferred between the (possibly many) coils, without a metallic connection between the two circuits. If the AC input voltage to the transformer includes a direct current (DC) signal in addition to the AC signal, flux in the core may reach the saturation levels during peak moments of the AC sine wave cycle. In this saturation condition, voltage induced in the secondary may not remain sinusoidal anymore, creating harmonics in the secondary winding output. The presence of harmonics on the AC power grid can cause overheating, power loss, reduced efficiency and shortened lifespan of the devices essential for the safe, resilient and cost effective operation of the power grid.

The sun can eject immense quantities of charged particles at relativistic speeds. This stream of charged particles—also called the solar wind—can collide with the Earth's magnetic field. Under normal conditions, there is a balance between the geomagnetic field of the Earth and the forces exerted by the solar wind. But during large scale solar events—called coronal mass ejections—the solar wind can be much greater and can effectively compress the Earth's magnetic field. That compression of the geomagnetic field both enhances and generates electric currents in the ionosphere. Charged particles can flow down the Earth's magnetic field lines in the polar regions producing the visual manifestation of a geomagnetic storm that is commonly known as an aurora. During large scale coronal mass ejections, the geophysical electric current systems responsible for the aurora can be pushed far southward in the northern hemisphere, and the aurora can be seen unusually far from the north polar regions. On the ground, the changing geomagnetic field induces an electric field, the relationship between the two is known as Faraday's Law. It is this induced geoelectric field near the surface of the Earth, measured in units of Volts per mile, that can be effectively "captured" by long conducting structures such as power lines. Power transmission lines can be hundreds of kilometers long, which effectively integrates the geoelectric field and produces currents that grow along the length of the conducting structure, potentially resulting in tens of thousands of volts of DC or quasi-DC current that can be generated in the span between substations.

An AC transformer, such as those employed at transmission power substations, is particularly susceptible to DC signals, which if unmitigated can lead to decrease efficiency, poor power quality and even catastrophic failure. Many substations and other components in an electrical grid include components that are meant to mitigate or protect the grid against the effects of DC current. One approach is to design new transformers that reduce the susceptibility to DC current. The design, development and deployment of new power transformers with a reduced susceptibility profile has significant cost implications that must necessarily be weighted in the context of the risk that geomagnetic disturbances would prose to the transformer in its proposed location on the grid. However, most authorities agree that taking action on just a few transformers on the power line would not significantly reduce the overall risk and therefore network wide action needs to be taken. Mitigation for existing transformers includes improved storm warning and real time awareness to utilities and deploying technologies including neutral blocking resistors, neutral blocking capacitors, and polarizing cells in series with the neutral have all been proposed and to some extent deployed. For example it is well known to those of ordinary skill in the art that the impedance of a capacitor in a parallel circuit is inversely proportional to frequency; as the frequency approaches zero (i.e., DC) the impedance approaches infinity. In signal processing terms, DC offset can be reduced in real-time by a high-pass filter. The stratagem of using blocking capacitors to filter deleterious DC or quasi-DC ground induced currents assumes both the risk of creating a single point of failure and allows induced currents to integrate over distance. A more resilient and extensible model would employ means to detect, separate and extinguish ground induced currents along a transmission or distribution line, before the electric field integrated over distance creates potentially devastating DC currents at substations.

Thus, there is a need for a cost effective system and method that can adequately protect an electric grid from ground induced currents incidental to large scale geomagnetic storms.

SUMMARY OF THE DISCLOSURE

Accordingly, systems and methods for mitigating ground induced currents are provided. In one or more examples, the systems and methods can utilize one or more device(s) that can be configured to detect DC currents being induced and propagated along a power line that is transmitting an AC power signal. In one or more examples the device can separate the desirable AC power waveform from the undesirable induced DC voltage and determine if the level of induced DC propagating on the power line requires mitigation.

If it is determined that the DC current is above a predetermined threshold, then in one or more examples the device can be further configured to determine the next window of time in which the AC power signal will experience a zero-crossing. This feature is desirable for the efficient operation of the invention because the timing of the precise zero crossing is important for the mitigation. A non-zero full cycle mean is indicative of a DC bias added to the AC power signal waveform that is sinusoidal in nature. Because the voltage frequency can shift slightly in response to changing demand or supply (for example, a load shedding event or generator trip) accurate tracking, statistics and prediction of the zero crossing is necessary to enable the mitigation is directed at the DC bias and not inadvertently impact the desirable AC power waveform. Once the time of the next zero-crossing is estimated, the device can be configured to operate a switch that closes during a determined window beginning slightly before and extending slightly after the predicted zero crossing so as to allow the current flowing in the power line at the precise instant of the zero crossing to flow to ground or some other off-grid component for the purpose of removing the DC current from the transmitted power signal. After a time scale measured in fractional microseconds, the switch is again reset, allowing the flow of the remaining 99.9999% of the AC voltage waveform through the grid, having effectively removed the DC component at the voltage frequency zero crossing. This process will be repeated as long as super-threshold DC voltage is detected on the AC power line. In one or more examples, once the window of time has terminated, the device can operate the switch so that the power signal is transmitted to the next component in the electric grid for distribution.

DETAILED DESCRIPTION

Figure 1:
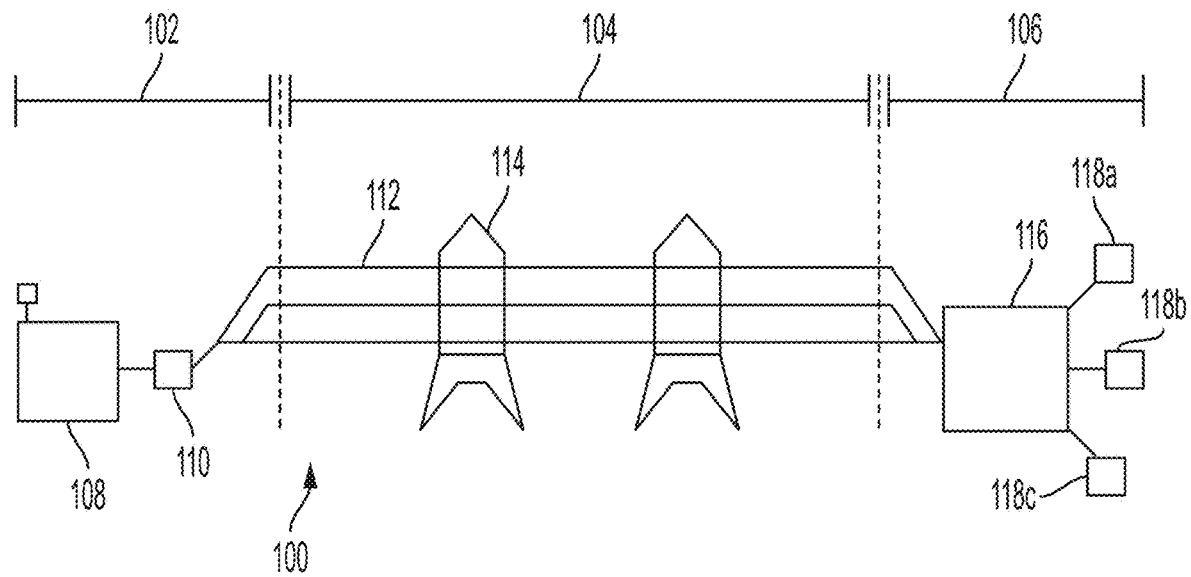
FIG. 1 illustrates an exemplary electricity generation and transmission system according to examples of the disclosure.

In the following description of the disclosure and embodiments, reference is made to the accompanying drawings in which are shown, by way of illustration, specific embodiments that can be practiced. It is to be understood that other embodiments and examples can be practiced and changes can be made without departing from the scope of the disclosure.

In addition, it is also to be understood that the singular forms "a," "an," and "the" used in the following description are intended to include the plural forms as well, unless the context clearly indicates otherwise. It is also to be understood that the term "and/or" as used herein refers to and encompasses any and all possible combinations of one or more of the associated listed items. It is further to be understood that the terms "includes," "including," "comprises," and/or "comprising," when used herein, specify the presence of stated features, integers, steps, operations, elements, components, and/or units but do not preclude the presence or addition of one or more other features, integers, steps, operations, elements, components, units, and/or groups thereof.

Some portions of the detailed description that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic, or optical signals capable of being stored, transferred, combined, compared, and otherwise manipulated. It is convenient at times, principally for reasons of common usage, to refer to these signals as bits, values, elements, symbols, characters, terms, numbers, or the like. Furthermore, it is also convenient at times to refer to certain arrangements of steps requiring physical manipulations of physical quantities as modules or code devices without loss of generality.

However, all of these and similar terms are to be associated with the appropriate physical quantities and are merely convenient labels applied to these quantities. Unless specifically stated otherwise as apparent from the following discussion, it is appreciated that, throughout the description, discussions utilizing terms such as "processing," "computing," "calculating," "determining," "displaying," or the like refer to the action and processes of a computer system, or similar electronic computing device, that manipulates and transforms data represented as physical (electronic) quantities within the computer system memories or registers or other such information storage, transmission, or display devices.

Certain aspects of the present invention include process steps and instructions described herein in the form of an algorithm. It should be noted that the process steps and instructions of the present invention could be embodied in software, firmware, or hardware, and, when embodied in software, could be downloaded to reside on and be operated from different platforms used by a variety of operating systems.

The present invention also relates to a device for performing the operations herein. This device may be specially constructed for the required purposes, or it may comprise a general-purpose computer selectively activated or reconfigured by a computer program stored in the computer. Such a computer program may be stored in a non-transitory, computer-readable storage medium, such as, but not limited to, any type of disk, including floppy disks, optical disks, CD-ROMs, magnetic-optical disks, read-only memories (ROMs), random access memories (RAMs), EPROMs, EEPROMs, magnetic or optical cards, application-specific integrated circuits (ASICs), or any type of media suitable for storing electronic instructions and each coupled to a computer system bus. Furthermore, the computers referred to in the specification may include a single processor or may be architectures employing multiple processor designs for increased computing capability.

The methods, devices, and systems described herein are not inherently related to any particular computer or other apparatus. Various general-purpose systems may also be used with programs in accordance with the teachings herein, or it may prove convenient to construct a more specialized apparatus to perform the required method steps. The required structure for a variety of these systems will appear from the description below. In addition, the present invention is not described with reference to any particular programming language. It will be appreciated that a variety of programming languages may be used to implement the teachings of the present invention as described herein.

Described herein are systems and methods for mitigating ground induced currents in commercial power infrastructure. In one or more examples of the disclosure, the systems and methods can implement a device configured to detect the presence of DC current on an AC electric power transmission line. Upon detecting a DC current, in one or more examples the DC current can be preferentially removed from the power waveform by the teachings of the disclosure. Specifically if the DC current is detected by the teaching of the invention and determined to be over a pre-determined threshold, the device can be configured to determine the next zero crossing of an AC signal being transmitted on the line, and then can be configured to activate a switch that can preferentially divert the DC current induced and flowing in an AC power line to a resistor or to ground so as to absorb the DC current found on the line while not affecting the propagation of AC current in the power grid. The disclosure uses the context of commercial power infrastructure to exemplify the disclosure, but the context should not be seen as limiting, and the systems and method described below can be employed in any context in which the presence of ground induced currents is unwanted.

In an exemplary electrical distribution scheme, electricity is generated at a power plant and then enters a "electric grid" (also known as an electrical grid or power grid) that facilitates the transmission and distribution of the electricity created at the power plant to the residential or commercial end user who consumes the electricity. Often times, the electric grid is required to transmit electricity generated at a power plant hundreds of miles before it can finally arrive at a distribution point. Likewise, power grid distribution lines can extend tens to hundreds of miles to deliver power to the end user for consumption. An electric grid can include many transmission lines and substations that collectively work together to transport the electricity across vast distances in a reliable and safe manner.

FIG. 1 illustrates an exemplary electricity generation and transmission system according to examples of the disclosure. The electricity generation and transmission system illustrated in FIG. 1 can be collectively described as an "electric grid." In the example of FIG. 1, electric grid 100 can include three sections: (1) a generation section 102, (2) a transmission section 104, and (3) a distribution section 106.

Generation section 102 can include the portions of the grid that are responsible for generating the electricity that is ultimately distributed by the electric grid 100 to the end-users. In one or more examples, the generation section 102 can include a power plant 108 that generates the electricity using such sources as nuclear, coal, hydro, wind, solar, etc. Power plant 108 can produce one or more AC signals to be distributed to the end users. In one or more examples, the power plant 108 can generate three-phase AC current in which the power plant transmits three separate AC signals (each 120 degrees out of phase with one another) over three separate transmission lines. Transmission lines can be very high voltage, typically more than 300,000 Volts and sometimes as high has 735,000 Volts.

Generation section 102 of the electric grid can also include a substation 110 that is configured to step-up the voltage generated by the power plant so as to make the power signal conducive to transmission across great distances. In one or more examples, substation 110 can include a step up transformer that is configured to increase the voltage of the AC signal generated by the power plant 108, so that the signal will be able to travel the large distance (i.e., hundreds of miles) necessary to reach the distribution point and ultimately the end users who will consume the electricity.

In one or more examples, the transformer core of substation 110 can be susceptible to damage from even relatively low voltage DC currents that may inadvertently be induced on the power lines exiting power plant 108 when the power lines are exposed to a geo-physical electric field such as is the case following the eruption of a coronal mass ejection from the sun, or injected into the AC signal generated from the power plant 108 by another external source. In one or more examples, the undesirable DC current—which grows as the geo-physical electric field is integrated over hundreds of kilometers of power line—could result in DC bias of thousand or tens of thousands of volts. To protect against or mitigate the effects of such an unwanted DC current, substation 110 can include any of several means to remove or mitigate unwanted DC current such as one or more capacitors (known as blocking capacitors) that are configured to filter out or remove the DC current from the line, while simultaneously allowing the AC current generated by the power plant to pass through.

In one or more examples, the electric grid 100 can include a transmission section 104. The transmission section 104 of the electric grid 100 can include transmission lines 112 that can transmit the AC signal produced by power plant 108. In one or more examples, transmission lines 112 can include three separate transmission lines, with each transmission line carrying a single phase of the three phase AC power signal produced by power plant 108. In one or more examples, transmission line 112 can span long lengths up to hundreds of miles depending on the number and location of generation stations 108 that collectively provide sufficient electrical power to offset residential and commercial demands for power from the interconnected distribution grid. As will be described in detail further below, the long length of the transmission lines can make them susceptible to developing DC currents generated by ground induced currents that can reduce the efficiency, diminish power quality and, in the limit, result in catastrophic failure of power line substations associated with electric grid 100. While distribution power lines are often shorter than transmission lines, during period of high geoelectric fields, currents can be induced in distribution lines that could have deleterious effects on distribution substations. However, in the case of distribution substations not only is the length of the conducting lines shorter, and the DC current induced proportionately less, but the impact felt by a substation failure is significantly reduced. However, one transmission line might supply hundreds or thousands of distribution lines. Hence, a transmission substation failure could have catastrophic impact.

In one or more examples, electric grid 100 can include one or more transmission towers 114. In one or more examples, transmission tower 114 can be configured to hold the transmission lines 112 above the ground and out of the way. The transmission towers 114 can be spaced a certain distance apart from one another in such a manner so as to provide the necessary structural support and isolation for the transmission lines 112.

In one or more examples, electric grid 106 can include a distribution section 106 that can be configured to distribute the electricity generated by generation section 102 and transmitted by transmission section 104 to one or more end users 118*a-c*. In one or more examples, the distribution section 106 can include a distribution substation 116 that can be configured to step-down the AC signal transmitted by transmission section 104 to a voltage level that is appropriate for distribution to an end user 118*a-c*. In one or more examples, the substation 116 can include a step-down transformer (not pictured) that can be configured to step the voltage down to the appropriate voltage level. These medium voltage distribution lines are stepped down even further, ultimately providing the electrical power to be consumed by the one or more end users 118*a-c*.

Similar to the example of substations 110, the transformer elements of substation 116 can also be susceptible to damage from inadvertent or stray DC currents injected into the electric grid by a ground induced current or other external entity. Similar to substation 108, in one or more examples of the disclosure, the substation 116 can include any of several means to block DC current, such as one or more blocking capacitors configured to filter out DC power and allowing AC power to reach the one or more end users 118*a-c*. However, as in the transmission line case, these blocking capacitors represent a single point of failure. If the DC power combined and propagating with the AC power waveform is too high, duration of the geomagnetic event is too long, poor maintenance, malicious intent and many other factors could reduce or negate the protection these blocking capacitors provide to transmission and distribution substations. Further, single point of failure architectures are not consistent with resilient power distribution requirement of the 21$^{st}$ century. Because in the current configuration of the power grid DC blocking capacitors are the primary or only means of regulating DC voltages on the power grid their compromise could have catastrophic consequences.

Ground induced currents are an example of a phenomenon that can induce DC or quasi-DC signals (collectively referred to as DC for the sake of this disclosure) in an electric grid. While these DC signals could grow to thousands and even tens of thousands of Volts, even relatively low levels of DC voltage can adversely impact power quality and cripple or severely damage transformers all along the electric grid that are designed and optimize to effectively work in an AC only system. There is mathematical certainty that future large-scale solar events will include coronal mass ejection directed towards the Earth. Without effective, multi-tiered and resilient mitigation, a large-scale geo-physical event could result in a complete collapse of the power grid resulting in profound national security, economic, and societal consequences. The power grids of other nations are based on the same alternating current technology, components and physical limitations and are equally susceptible to ground induced currents. Many of the large multi-hundred kV transformers used in transmission transformers in the US and abroad are not off the shelf nor easily replaced. It is critical that the protection of these essential components not depend on a single line of defense.

Figure 2:
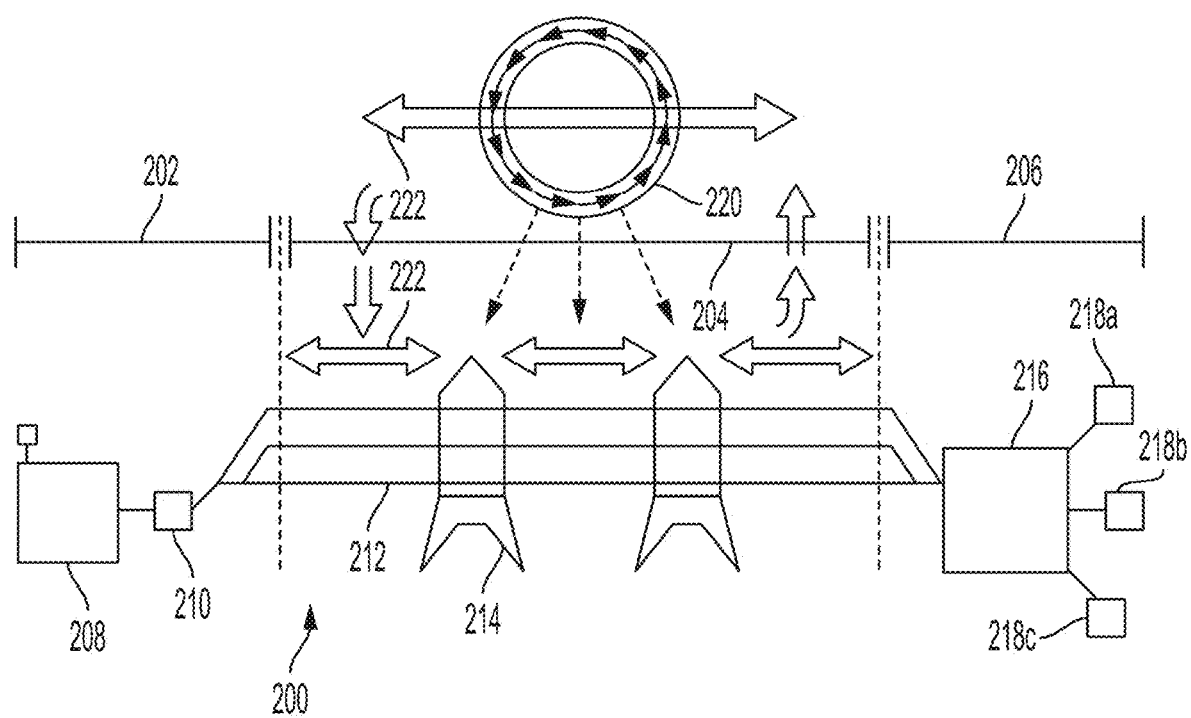
FIG. 2 illustrates an exemplary electricity generating and transmission system undergoing an event that causes a ground induced current in the system according to examples of the disclosure.

FIG. 2 illustrates an exemplary electricity generating and transmission system undergoing an event that causes a ground induced current in the system according to examples of the disclosure. The electric grid 200 is substantially similar to the electric grid 100 discussed above with respect to FIG. 1. Thus, for an explanation of components 202, 204, 206, 208, 210, 212, 214, 216, and 218*a-c*, the discussion with respect to their counterparts from FIG. 1 (i.e., 102, 104, 106, 108, 110, 112, 114, 116, and 118*a-c* respectively) can be referenced above.

In one or more examples, a ground induced current can be caused by fluctuations in the Earth's magnetic field caused by extreme space weather. For instance, in one or more examples, a coronal mass ejection (i.e., a solar storm or geomagnetic storm) can cause large fluctuations in the magnetic field in space that can have an impact on the Earth's upper atmosphere, and specifically the Earth's magnetosphere. In one or more examples, a coronal injection can compress the magnetosphere which in turn can generate a corresponding flux in the electric field (due to Ampere's Law with Maxwell's additions) which—on the surface of the Earth can be on the order of tens of Volts per kilometer (V/km). The timescale for such an event can be tens of minutes to multiple hours, thus potentially such a geophysical electric field can have significant impact on the Earth. In one or more examples, the magnetosphere compression shown at 220 could be engendered by a man-made electromagnetic pulse (EMP) rather than a naturally occurring phenomenon such as a solar storm but EMP phenomena—while potentially much more intense—is much shorter duration and profile from ground induced currents incidental to a coronal mass ejection. In one or more examples, the duration can be from a few milliseconds to the order of a second.

Referring back to FIG. 2, the compression of the magnetosphere is illustrated at 220. When the magnetosphere compresses as indicated at 220, it can induce a corresponding electric field 222 that extends from the upper atmosphere to the ground at certain preferred orientations relative to the Earth's magnetic field lines. The electric field on the ground can be such that the electric field 222 can be coupled into the long conducting transmission lines 212. In one or more examples, the massive E field shown at 222 could be engendered by a man-made electromagnetic pulse (EMP) rather than a naturally occurring phenomenon such as a solar storm.

In one or more examples, the electric field 222 can be measured in terms of volts per kilometer. Thus, as the electric field propagates over a conductive medium (such as a transmission line), the strength of the induced voltage increases as a function of the length of the conductor exposed to the field. In the example of FIG. 2, if the transmission lines 212 are hundreds of kilometers, the voltage experienced on the electric grid can be in the range of thousands of volts DC. In one or more examples, the highest quasi-static geophysical electrical field detected on the surface of the Earth can be on the order of 20V/km. Therefore, over 100 km the voltage can be 2000V, while over 1000 km of wire the voltage can be 20,000V. In the context of an electric grid, an induced DC voltage could likely cause harmonic distortion and saturation on the core of the AC transformers in substation 210 or substation 216. At a high DC voltage level, the blocking capacitors (discussed above) may not adequately protect the transformers in the substation, or may fail. In one or more examples, even if the DC blocking capacitor were to be rated to handle voltages in the range of a potential ground induced current, if the duration of the geo-physical event leading to ground induced voltage is long, then over time the effectiveness of the capacitor to block DC currents could become compromised.

A system as critical as the commercial power grid should not depend on single point of failure mitigation. Disclosed herein are simple and highly cost effective systems and methods that would not only make blocking capacitors at substations more effective, but would also provide an added degree of protection that is resilient through decentralization and effectively mitigates ground induced currents before they integrate over distance to threaten the power grid.

In one or more examples, the systems and methods can be configured to separate normal AC voltage from undesirable DC currents induced in transmission lines from high electric fields created by geo-physical processes such as coronal mass ejections.

Figure 3:
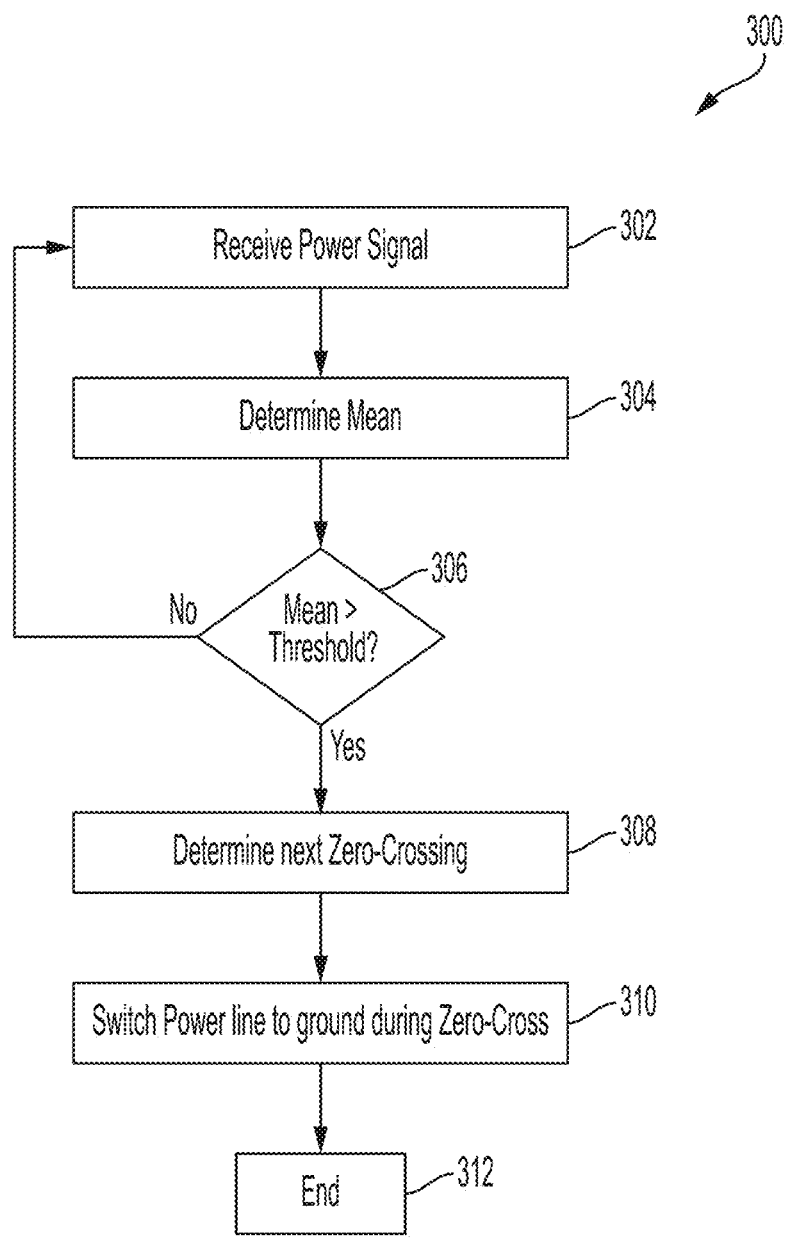
FIG. 3 illustrates an exemplary process for mitigating ground induced currents according to examples of the disclosure.

In one or more examples, a device to mitigate ground induced currents can implement a process in which the presence of a DC bias is detected and the induced DC voltage is separated from the desirable AC power waveform and is mitigated in a manner that does not cause substantial disruption to the electrical grid. FIG. 3 illustrates an exemplary process for mitigating ground induced currents according to examples of the disclosure. In one or more examples, the process 300 depicted at FIG. 3 can begin at step 302 wherein a signal corresponding to the electric power signal which can be corrupted by the addition of a low level DC voltage is transmitted on a transmission line and is received by the device. Once the signal is received at step 302, the process can move to step 304 wherein the average full cycle signal level received at step 302 is determined. Because the AC power waveform is a sine wave, the full cycle average voltage can be identically zero and the average value over the half cycle is 0.637 $V_{Max}$. In one or more examples, the AC voltage waveform (i.e., the electric signal) transmitted across the electric grid can be a periodic waveform that oscillates at a given frequency, normally 60 Hz in the US and certain other region, at 50 Hz in others. In reality, the actual voltage frequency varies at any location and point in time as a complicated function of instantaneous demand for electrical energy, available supply and characteristics of the grid. However, because the voltage waveform is alternating current, it is very closely approximated as a sine wave which has a zero average voltage, and the voltage crosses the zero voltage point at two places in each cycle between a positive and negative value, with an average signal level of zero volts. However, in the presence of an additive DC signal on the sinusoidal AC power waveform, (such as that created by a ground induced current) the average signal on the transmission line may be non-zero.

Once the average of the signal on the transmission line is calculated, the process can move to step 306 wherein the average signal determined at step 304 can be compared against a pre-determined threshold. In one or more examples, the mere presence of a very small DC signal on a transmission line may not warrant engaging in a mitigation process, so the process of mitigating a DC signal may only be undertaken if the DC signal is above a certain threshold. In one or more examples, the pre-determined threshold can be set such that the DC signal appearing on the transmission line was likely created by a ground induced current rather than an incidental DC signal that does not present a substantial threat to the electric grid. In one or more examples, the threshold can be determined by measuring the background and tolerance of the equipment on the grid to DC bias signals. In one or more examples, the threshold can be on the order of several tens of volts.

In one or more examples, if the mean is found to be less than the predetermined threshold, then the process can revert back to step 302 wherein the voltage waveform can be received and the process can start over. If, however, the mean is found to be greater than the predetermined threshold, the process can move to step 308 wherein the process of mitigating the DC fault can be initiated. In one or more examples at step 308, the process 300 can analyze the signal at step 302 to determine when the next zero crossing of the signal will occur. As previously discussed, the AC signal (i.e., the electric signal) transmitted on the transmission lines can be manifested as a periodic waveform that oscillates between a positive voltage and a negative voltage that are equal in magnitude but in opposite polarities. While, the AC signal can be manifested as described above, the power system can be a complex dynamic system. The voltage and current phasors in a power system can undergo a dynamic variation in response to changes in loads, supply, disturbances, and faults. Fast prediction on the rate of change of these phasors and acceleration of changes can include various conventional methods such as including pre-detection low pass filtering, post processing signal condition, simple optical isolated semiconductor devices, zero-crossing detection by interpolation, comparator circuits with fixed hysteresis, and comparator optical frequency filtering. Least squares methods have also been applied to prediction of the zero-crossing point. (Sachev, M. S., Baribeau, M. A., "New algorithm for digital impedance relays, power apparatus and systems," IEEE Transactions, Vol PAS-98, No 6 pp 2231-2240, 1979.)

Figure 4A:
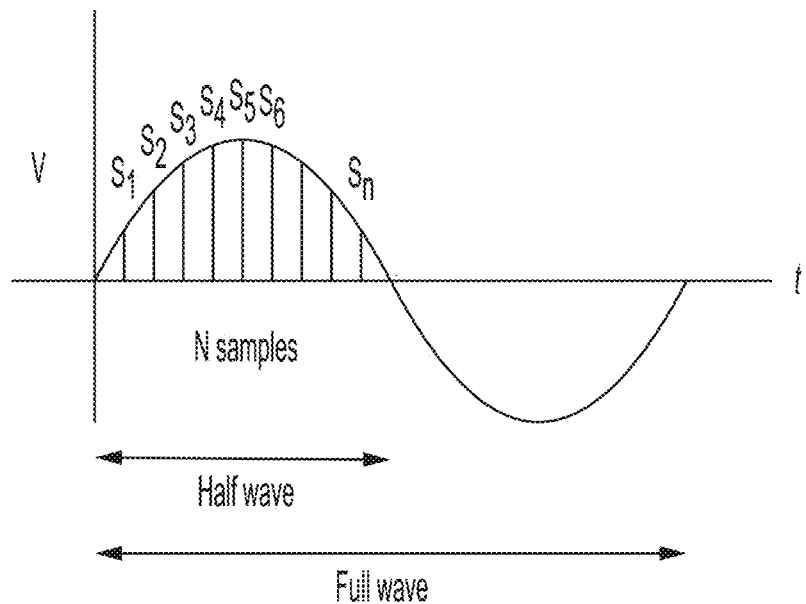
FIGS. 4A-4B illustrate exemplary transmission line waveforms according to examples of the disclosure.
Figure 4B:
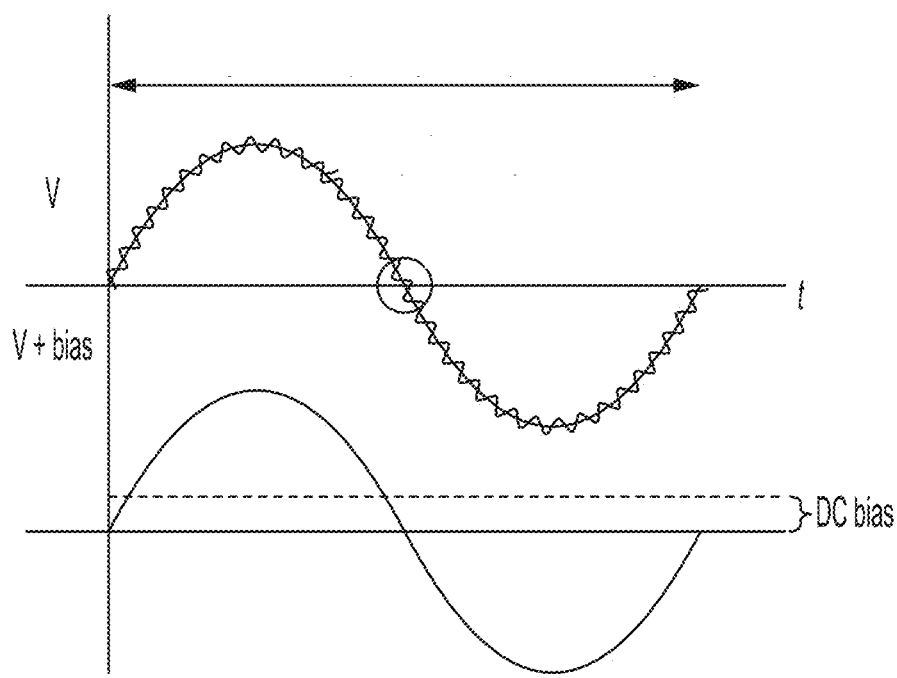

Those of ordinary skill in the art will recognize that the average or mean value of a symmetrical alternating quantity, such as a sine wave, over one complete cycle is zero. The most ready way to detect a DC bias on the AC mains can be to test this condition by evaluating the average or mean value of the voltage waveform per full wave cycle. For example, consider a half wave voltage signal illustrated in FIGS. 4A-B. FIG. 4A illustrates an exemplary transmission line waveform without effects from a DC bias or user demand according to one or more examples of the disclosure. FIG. 4B illustrates the same waveform of FIG. 4A with the effects of a DC bias and frequency changes in response to supply, demand, disturbance, and fault included. It should be noted that the noise signal illustrated in FIG. 4B is not drawn to scale, nor is the figure meant to accurately represent the time domain response of the noise signal. In one or more examples, the noise signal can be perpendicular to the voltage waveform so that any given moment in time there is one voltage.

Each mid-ordinate value of the voltage waveform can beaded to the next and the summed total, $V_1$ to $V_n$ is divided by the number of mid-ordinates used to give the "Average Voltage". Then the average voltage ($V_{AV}$) is the mean sum of mid-ordinates of the voltage waveform and is given as:

$$V_{AV} = \frac{\text{sum of all the mid ordinates}}{\text{number of samples}}$$

As shown above, if the voltage waveform is symmetric, the average across a full cycle can be identically zero. The presence of a non-zero component can indicate a DC bias.

There are numerous ways to measure the RMS or average of the full wave mains voltage waveform. For example, one approach can involve the use of an isolation/step down transformer and potentiometer to step down mains AC. After a low pass filter the signal is directed to a microcontroller ADC input pin for voltage measurement. In one or more examples of the present invention, the point in time when the AC signal on the transmission line is approaching or is at a zero crossing can represent an instant in time when the only signal on the transmission line is substantively the DC signal that is the target of mitigation. When the AC signal is at or near zero, the voltage waveform is not actively providing any power to a user, and thus the precise moment in time presents an opportunity to remove the DC signal from the line without having a substantial effect or interruption of the AC signal on the line.

In one or more examples, the zero crossing of the signal can be determined using a variety of techniques. For instance, in one or more examples, the zero crossing can be determined at step 308 by curve fitting a sinusoid during a regression analysis, in which the coefficients of the sinusoid can be determined and used to determine the moment in time when the sinusoid is likely to be zero or near zero. Alternatively, or in addition to the above example, the zero crossing can be determined at step 308 by performing alpha beta tracking, Kalman filtering, or another filtering method that can take past dynamics and the uncertainty on the measurement and propagate the future state and associated uncertainty at step 302.

Once the next zero-crossing is determined at step 308, the process can move to step 310, wherein the device can operate a switch to, at a time precisely related to the exact zero crossing, divert the signal on the transmission line off the electrical grid by either shunting the signal to ground, or shunting the signal to a resistive load that can dissipate the DC signal as heat. By removing the DC signal or at least reducing its intensity from the transmission line, the DC signal's ability to integrate over distance is reduced and the stress placed on blocking capacitor and other forms of ground induced current mitigation at the substation are minimized. In one or more examples, at step 310, the switch can be moved so as to shunt the DC signal for a predetermined time, typically measured in tens or hundreds of nanoseconds. The time before and after the predicted zero crossing that the switch is opened can be variable based on a number of conditions including the magnitude of the DC bias and its rate of change, its duration, geographic extent and other conditions. In this way, the DC signal can be extracted from the AC power waveform in a manner that minimizes any disruption to the AC signal experienced by the end users of the electric grid. Once the switch is moved back to its original position at step 308, so that the transmission line is transmitting the electric signal to the end users, the process can move to step 312 wherein the process is terminated.

Figure 5:
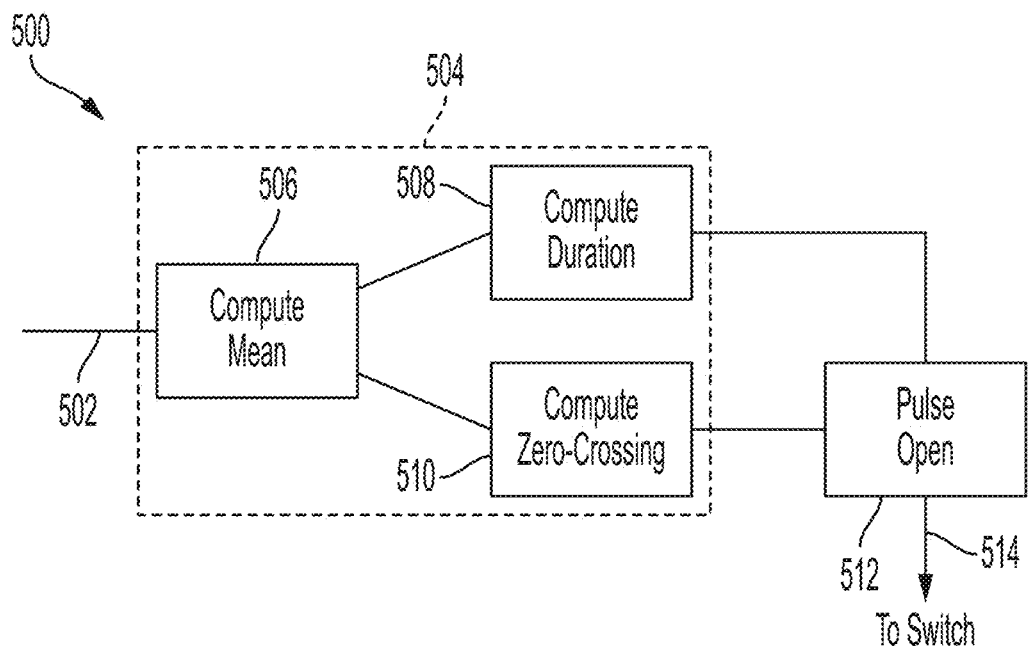
FIG. 5 illustrates an exemplary device configured to mitigate ground induced currents according to examples of the disclosure.

The above process can be implemented in a device that is configured to control a switch that when activated can shunt the signal being transmitted on a transmission line to either ground or a dissipative load or circuit for the purpose of removing or mitigating the amount of DC current traveling over the transmission lines of an electric grid. FIG. 5 illustrates an exemplary device configured to mitigate ground induced currents according to examples of the disclosure. The device 500 of FIG. 5 can be configured to generate a trigger signal (described in detail below) that can be transmitted at a particular instance of time and for a particular very brief duration of time based on the characteristics of the electric signal being transmitted on a transmission line of an electric grid. In one or more examples, the duration can be on the order of microseconds. In one or more examples, the duration can be limited by the number of amps of current that needs to be dissipated while the voltage waveform is close to zero.

In one or more examples, the device 500 can include an input 502 that can accept a signal that represents a signal currently being transmitted on a transmission line in the electric grid. In one or more examples, the input 502 can be taken directly from the transmission line. Alternatively, in one or more examples, the magnetic field generated by the transmission line can be measured (using non-contact lossless methods known to those skilled in the art). Since current on a transmission line is proportional to the magnetic field generated by the line, the magnetic reading can be used to in essence to measure the current. The signal can enter the device at input 502 and enter a component within the device that is configured to calculate an average of a single cycle of the signal in accordance with step 304 as described above with respect to FIG. 3. If the average calculation component 506 determines that the mean of the signal encountered at input 502 is greater than a pre-determined threshold (i.e., in accordance with step 306 of FIG. 3), the component 506 can send a trigger signal to a component 510 that can compute the next zero crossing of the signal received at input 502 in accordance with the process discussed above at step 308 of FIG. 3.

In summary, component 506 can be used to determine if the switch should be triggered, and component 510 can be configured to determine the precise moment in time when the switch should be triggered relative to the predicted zero crossing. In one or more examples each of components 502, and 504 can be implemented in hardware, or alternatively any combination of the components 502 or 504 can be implement on one or more processors controlled by software configured to implement the functions described above with respect to components 502, and 504.

In one or more examples, the output of component 510 can be used as control signals to generate a pulse that can control a switch to shunt the DC signal if needed. In one or more examples, a pulse generation component 512 can be used to generate a pulse at output 514. The output signal of component 510 can be used to determine the precise moment in time when the pulse is to begin. In one or more examples component 512 can be implemented using a MOSFET or kryton or other suitable high speed that can be used to control a highly precise, very short duration pulse signal.

In one or more examples, the device of FIG. 5 can be used to control a switch that in a first mode can be configured to allow a signal to flow through a transmission line of an electric grid, and in a second mode be configured to shunt the signal on a transmission line to ground or some circuit including a resistor that converts the extraneous DC current to heat. The device of FIG. 5 can not only be configured to operate a switch as described above, but can also be configured to operate additional devices that can help to mitigate any adverse effects on the signal caused by the switching of the line itself. As an example, the switching of the line between the first mode and the second mode can introduce low voltage frequency artifacts that can distort electric signals arriving at an end user. Thus, in addition to shunting away the DC signal off of the transmission line, a device such as the one described above with respect to FIG. 5 can also be configured to activate a device or circuitry such as a filter to remove any frequency artifacts caused by the switching of the line.

Figure 6:
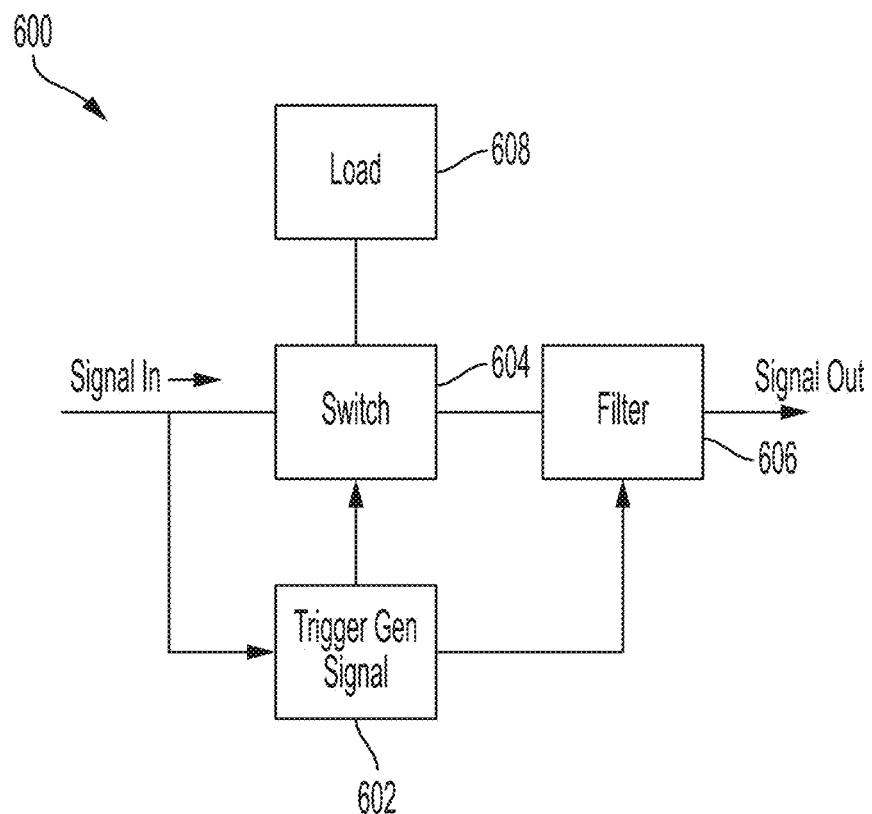
FIG. 6 illustrates an exemplary electricity generating and transmission system configured with a plurality of devices configured to mitigate ground induced currents according to examples of the disclosure.

FIG. 6 illustrates an exemplary system for mitigating ground induced currents according to examples of the disclosure. In one or more examples, and as described in further detail below, the device of FIG. 6 can be communicatively coupled to a switch and a filter so that when the device detects a ground induced current it can activate the switch and the filter so as to mitigate the ground induced current while simultaneously minimizing the impact to the electric grid caused by the mitigation.

In the example of FIG. 6, the system 600 can include a trigger signal generator 602 that can be substantially configured in the same manner as described above with respect to FIG. 5. The trigger generation signal 602 produces one or more "trigger signals" that can be used to control a switch 604. As described in detail above with respect to FIG. 5, the trigger signal generator 602 can be configured to send a trigger signal at a particular time based on the calculated next zero crossing of the input signal. The switch 604 can be operated in a first mode, wherein the input signal is allowed to pass through filter 606 and output so as to travel through the grid. In one or more examples, the switch 604 can also be operated in a second mode, wherein the input signal can be switched to load 608 wherein the signal is shunted to ground or to a dissipative circuit that can bleed the DC current off the transmission line.

In one or more examples, the trigger signal generator 602 can also transmit a control signal to a filter 606 that can be switchably activated to apply a band pass filter to the signal being outputted by the system. In one or more examples, when switch 604 is toggled between the first mode and the second mode, even though the effect occurs at the AC zero crossing it may produce undesirable low voltage frequency artifacts on the transmission line that can ultimately degrade the quality of the signal being received by an end user. Thus, when the trigger signal generator transmits a signal to control switch 604, it can also send a control signal to filter 606 to activate so that the filter can mitigate any frequency artifacts (such as harmonic distortion) caused by the movement of switch 604. In one or more examples, filter 606 can be implemented as an RLC or LC circuit whose time constant is tuned to a specific frequency band for filtering.

Figure 7:
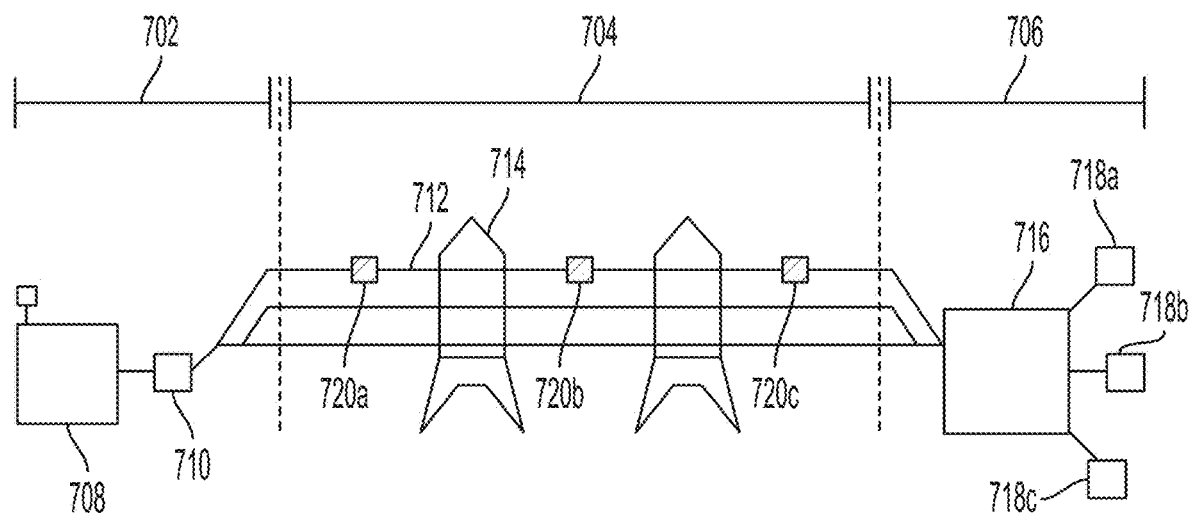
FIG. 7 illustrates an exemplary configuration for placement of a device configured to mitigate ground currents according to examples of the disclosure.

FIG. 7 illustrates an exemplary configuration for placement of a device configured to mitigate ground currents according to examples of the disclosure. The electric grid 700 is substantially similar to the electric grid 100 discussed above with respect to FIG. 1. Thus, for an explanation of components 702, 704, 706, 708, 710, 712, 714, 716, and 718a-c, the discussion with respect to their counterparts from FIG. 1 (i.e., 102, 104, 106, 108, 110, 112, 114, 116, and 118a-c respectively) can be referenced above.

In one or more examples, the systems and methods described above with respect to FIGS. 3-6 can be placed in multiple locations along an electric grid. The placement of the current invention at multiple points along a power line so each can individually mitigate ground induced currents can serve at least two purposes. First, by using multiple devices, the risk of a single point failure causing the entire grid to be inoperable is minimized. Second, as described above in detail above, since ground induced currents increase in magnitude the further they propagate along a transmission, by placing multiple devices along the transmission line, the maximum distance that a ground induced current can travel along the electric grid before encountering a mitigation device can be minimized thereby lowering the magnitude of the DC current that any in-line or subsystem based mitigation would face.

Returning to the example of FIG. 7, in one or more examples, the devices for mitigating ground induced currents 620a-c that are configured according the examples of the disclosure discussed above with respect to FIGS. 3-5 are illustrated in the figure as being placed at multiple locations along the transmission lines 712. While in the example of FIG. 6 the devices 620a-are shown as being placed along the transmission lines 712 in the transmission portion 704 of the electric grid 700, this disclosure should not be seen as limiting, and the devices such as 620a-can be placed anywhere in the electric grid 700. Furthermore, while FIG. 7 illustrates three separate devices that are deployed on the electric grid 700, the disclosure should not be seen as limiting, and an electric grid can utilize more or less devices to effectively mitigate ground induced currents.

The systems and methods provided above for mitigating ground induced currents can not only remove ground induced currents but can do so in a manner that minimizes any interference to the normal operation of infrastructure that may be susceptible to a ground induced current.

Figure 8:
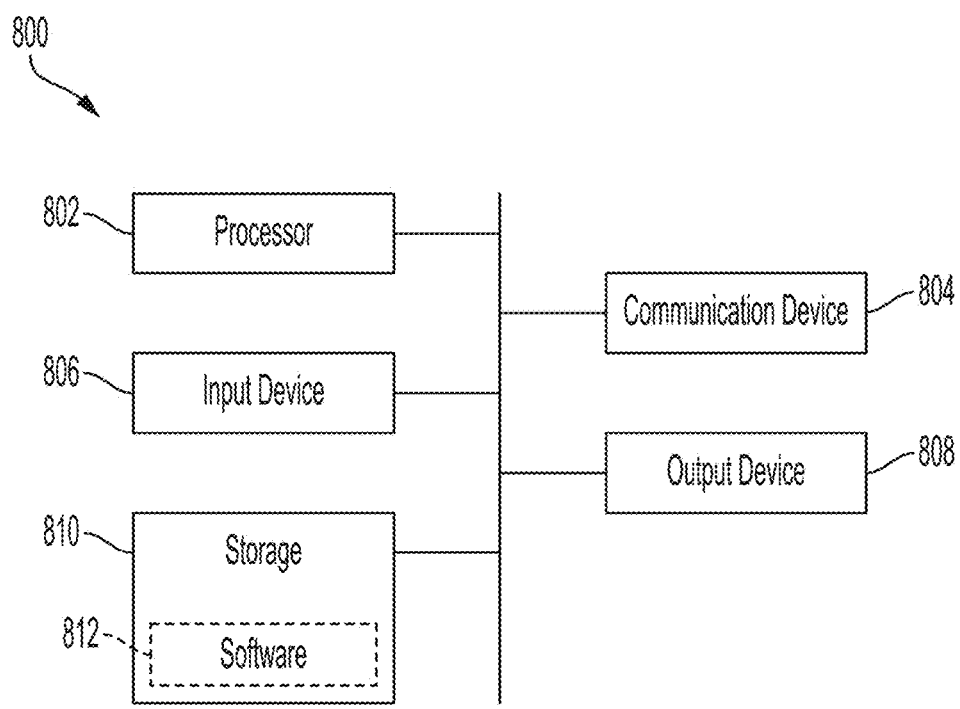
FIG. 8 illustrates an example of a computing device in accordance with one embodiment.

FIG. 8 illustrates an example of a computing device in accordance with one embodiment. Device 800 can be a host computer connected to a network. Device 800 can be a client computer or a server. As shown in FIG. 8, device 800 can be any suitable type of microprocessor-based device, such as a personal computer, workstation, server, or handheld computing device (portable electronic device), such as a phone or tablet. The device can include, for example, one or more of processors 810, input device 806, output device 808, storage 810, and communication device 804. Input device 806 and output device 808 can generally correspond to those described above and can either be connectable or integrated with the computer.

Input device 806 can be any suitable device that provides input, such as a touch screen, keyboard or keypad, mouse, or voice-recognition device. Output device 808 can be any suitable device that provides output, such as a touch screen, haptics device, or speaker.

Storage 810 can be any suitable device that provides storage, such as an electrical, magnetic, or optical memory, including a RAM, cache, hard drive, or removable storage disk. Communication device 804 can include any suitable device capable of transmitting and receiving signals over a network, such as a network interface chip or device. The components of the computer can be connected in any suitable manner, such as via a physical bus or wirelessly.

Software 812, which can be stored in storage 810 and executed by processor 802, can include, for example, the programming that embodies the functionality of the present disclosure (e.g., as embodied in the devices as described above).

Software 812 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 810, that can contain or store programming for use by or in connection with an instruction execution system, apparatus, or device.

Software 812 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate, or transport programming for use by or in connection with an instruction execution system, apparatus, or device. The transport readable medium can include, but is not limited to, an electronic, magnetic, optical, electromagnetic, or infrared wired or wireless propagation medium.

Device 800 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 800 can implement any operating system suitable for operating on the network. Software 812 can be written in any suitable programming language, such as C, C++, Java, or Python. In various embodiments, application software embodying the functionality of the present disclosure can be deployed in different configurations, such as in a client/server arrangement or through a Web browser as a Web-based application or Web service, for example.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

This application discloses several numerical ranges in the text and figures. The numerical ranges disclosed inherently support any range or value within the disclosed numerical ranges, including the endpoints, even though a precise range limitation is not stated verbatim in the specification because this disclosure can be practiced throughout the disclosed numerical ranges.

In one aspect, a device for mitigating ground induced currents comprises: an input configured to receive electrical signals, a memory, one or more processors, wherein the one or more processors are configured to execute instructions stored on the memory that when executed by the processor, cause the device to: receive at the input, a plurality of values corresponding to a signal propagating on a conductive path, wherein each value of the received signal corresponds to a voltage of the signal propagating on the conductive path at a particular moment in time, determine an average value of the signal received at the input, if the determined average value of the signal exceeds a predetermined value: estimate a time in the future when the voltage of the received signal will be zero volts based on the plurality of values received at the input, transmit the control signal to control a switch that upon receiving the control signal is configured to shunt the signal propagating on the conductive path to a circuit element configured to dissipate a current directed to it, wherein the control signal is transmitted at the estimated time when the voltage of the received signal will be zero volts, and terminate transmission of the control signal when a duration of time that the control signal has been transmitted is equal to a pre-determined threshold.

In some aspects of the device, the processor is further caused to: determine if the average value of the signal is at or below a predetermined value: control the switch so that the signal propagating on the conductive path is permitted to continuing propagating on the conductive path.

In some aspects of the device estimating a time in the future when the voltage of the received AC signal will be zero volts based on the plurality of values received at the input includes by curve fitting a sinusoid onto the received plurality of values.

In some aspects of the device one or more coefficients of the curve fitted sinusoid can be determined and used to determine the time in the future when the sinusoid is likely to be zero volts.

In some aspects of the device a rate of change of frequency of the curve fitted sinusoid can be determined and used to determine the time in the future when the sinusoid is likely to be zero volts.

In some aspects of the device shunting the signal propagating on the conductive path to a load includes transmitting the signal on the conductive path to ground.

In some aspects of the device shunting the signal propagating on the conductive path to a load includes transmitting the signal on the conductive path to a dissipating circuit, such as a resistive load so as to dissipate the signal on the conductive path as heat.

In some aspects of the device transmitting the control signal to control a switch that upon receiving the control signal is configured to shunt the signal propagating on the conductive path to a load includes activating a MOSFET switch to conduct a trigger signal that is transmitted to the switch.

In some aspects of the device, the device is further caused to generate a control signal to activate a filter situated on the conductive path if the determined average value of the signal exceeds the predetermined value. In some aspects of the device, the filter is an LC circuit.

In another aspect, a method for mitigating ground induced currents, the method comprising: receiving at the input, a plurality of values corresponding to a signal propagating on a conductive path, wherein each value of the received signal corresponds to a voltage of the signal propagating on the conductive path at a particular moment in time, determining an average value of the signal received at the input, if the determined average value of the signal exceeds a predetermined value, estimating a time in the future when the voltage of the received signal will be zero volts based on the plurality of values received at the input, transmitting the control signal to control a switch that upon receiving the control signal is configured to shunt the signal propagating on the conductive path to a circuit element configured to dissipate a current directed to it, wherein the control signal is transmitted at the estimated time when the voltage of the received signal will be zero volts, and terminating transmission of the control signal when a duration of time that the control signal has been transmitted is equal to a pre-determined threshold.

The above description is presented to enable a person skilled in the art to make and use the disclosure and is provided in the context of a particular application and its requirements. Various modifications to the preferred embodiments will be readily apparent to those skilled in the art, and the generic principles defined herein may be applied to other embodiments and applications without departing from the spirit and scope of the disclosure. Thus, this disclosure is not intended to be limited to the embodiments shown but is to be accorded the widest scope consistent with the principles and features disclosed herein.

What is claimed is:

1. A device for mitigating ground induced currents, the device comprising:
    an input configured to receive electrical signals;
    a memory;
    one or more processors, wherein the one or more processors are configured to execute instructions stored on the memory that when executed by the one or more processors, cause the device to:
    receive a plurality of values corresponding to a signal propagating on a conductive path, wherein each value corresponds to a voltage of the signal propagating on the conductive path at a particular moment in time;
    determine an average value of the plurality of values corresponding to the signal propagating on the conductive path;
    if the determined average value of the values of the plurality of values corresponding to the signal propagating on the conductive path exceeds a predetermined value:
        estimate a time in the future when the voltage of the signal propagating on the conductive path will be zero volts based on the plurality of values received at the input;
        transmit a control signal to control a switch that upon receiving the control signal is configured to shunt the signal propagating on the conductive path to a circuit element configured to dissipate a current directed to it, wherein the control signal is transmitted at the estimated time when the voltage of the received signal will be zero volts; and
        terminate transmission of the control signal when a duration of time that the control signal has been transmitted is equal to a pre-determined threshold.
2. The device of claim 1, wherein the one or more processors is further caused to:
    determine if the average value of the signal is at or below a predetermined value:
        control the switch so that the signal propagating on the conductive path is permitted to continuing propagating on the conductive path.
3. The device of claim 1, wherein the estimating a time in the future when the voltage of the signal propagating on the conductive path will be zero volts based on the plurality of values received at the input includes by curve fitting a sinusoid onto the received plurality of values.
4. The device of claim 3, wherein one or more coefficients of the curve fitted sinusoid can be determined and used to determine the time in the future when the sinusoid is likely to be zero volts.
5. The device of claim 3, wherein a rate of change of frequency of the curve fitted sinusoid can be determined and used to determine the time in the future when the sinusoid is likely to be zero volts.
6. The device of claim 1, wherein shunting the signal propagating on the conductive path to a load includes transmitting the signal on the conductive path to ground.
7. The device of claim 1, wherein shunting the signal propagating on the conductive path to a load includes transmitting the signal on the conductive path to a dissipating circuit, such as a resistive load so as to dissipate the signal on the conductive path as heat.
8. The device of claim 1, wherein transmitting the control signal to control the switch that upon receiving the control signal is configured to shunt the signal propagating on the conductive path to a load includes activating a MOSFET switch to conduct a trigger signal that is transmitted to the switch.
9. The device of claim 1, wherein the device is further caused to generate a control signal to activate a filter situated on the conductive path if the determined average value of the signal exceeds the predetermined value.
10. The device of claim 9, wherein the filter is an LC circuit.
11. A method for mitigating ground induced currents, the method comprising:
    receiving a plurality of values corresponding to a signal propagating on a conductive path, wherein each value corresponds to a voltage of the signal propagating on the conductive path at a particular moment in time;
    determining an average value of the plurality of values corresponding to the signal propagating on the conductive path;
    if the determined average value of the values of the plurality of values corresponding to the signal propagating on the conductive path exceeds a predetermined value:
    estimating a time in the future when the voltage of the signal propagating on the conductive path will be zero volts based on the plurality of values received at the input;
    transmitting a control signal to control a switch that upon receiving the control signal is configured to shunt the signal propagating on the conductive path to a circuit element configured to dissipate a current directed to it, wherein the control signal is transmitted at the estimated time when the voltage of the received signal will be zero volts; and
    terminating transmission of the control signal when a duration of time that the control signal has been transmitted is equal to a pre-determined threshold.
12. The method of claim 11, comprising:
    if the determined average value of the signal is below a predetermined value:

control the switch so that the signal propagating on the conductive path is permitted to continuing propagating on the conductive path.

13. The method of claim 11, wherein the estimating a time in the future when the voltage of the signal propagating on the conductive path will be zero volts based on the plurality of values received at the input includes by curve fitting a sinusoid onto the received plurality of values.

14. The method of claim 13, wherein one or more coefficients of the curve fitted sinusoid can be determined and used to determine the time in the future when the sinusoid is likely to be zero volts.

15. The device of claim 13, wherein a rate of change of frequency of the curve fitted sinusoid can be determined and used to determine the time in the future when the sinusoid is likely to be zero volts.

16. The method of claim 11, wherein shunting the signal propagating on the conductive path to a load includes transmitting the signal on the conductive path to ground.

17. The method of claim 11, wherein shunting the signal propagating on the conductive path to a load includes transmitting the signal on the conductive path to a dissipating circuit, such as a resistive load so as to dissipate the signal on the conductive path as heat.

18. The method of claim 11, wherein transmitting the control signal to control the switch that upon receiving the control signal is configured to shunt the signal propagating on the conductive path to a load includes activating a MOSFET switch to conduct a trigger signal that is transmitted to the switch.

19. The method of claim 11, wherein the method further comprises generating a control signal to activate a filter situated on the conductive path if the determined average value of the signal exceeds the predetermined value.

20. The method of claim 19, wherein the filter is an LC circuit.

21. A non-transitory computer readable storage medium storing one or more programs, the one or more programs for mitigating ground induced currents and comprising instructions, which, when executed by an electronic device with a display and a user input interface, cause the device to:
receive a plurality of values corresponding to a signal propagating on a conductive path, wherein each value corresponds to a voltage of the signal propagating on the conductive path at a particular moment in time;
determine an average value of the plurality of values corresponding to the signal propagating on the conductive path;
if the determined average value of the values of the plurality of values corresponding to the signal propagating on the conductive path exceeds a predetermined value:
estimate a time in the future when the voltage of the signal propagating on the conductive path will be zero volts based on the plurality of values received at the input;
transmit a control signal to control a switch that upon receiving the control signal is configured to shunt the signal propagating on the conductive path to a circuit element configured to dissipate a current directed to it, wherein the control signal is transmitted at the estimated time when the voltage of the received signal will be zero volts; and
terminate transmission of the control signal when a duration of time that the control signal has been transmitted is equal to a pre-determined threshold.

22. A non-transitory computer readable storage medium of claim 21, wherein the device is further caused to:
if the determined average value of the signal is below a predetermined value:
control the switch so that the signal propagating on the conductive path is permitted to continuing propagating on the conductive path.

23. The non-transitory computer readable storage medium of claim 21, wherein the estimating a time in the future when the voltage of the signal propagating on the conductive path will be zero volts based on the plurality of values received at the input includes by curve fitting a sinusoid onto the received plurality of values.

24. The computer readable storage medium of claim 23, wherein one or more coefficients of the curve fitted sinusoid can be determined and used to determine the time in the future when the sinusoid is likely to be zero volts.

25. The computer readable storage medium of claim 23, wherein a rate of change of frequency of the curve fitted sinusoid can be determined and used to determine the time in the future when the sinusoid is likely to be zero volts.

26. The computer readable storage medium of claim 21, wherein shunting the signal propagating on the conductive path to a load includes transmitting the signal on the conductive path to ground.

27. The computer readable storage medium of claim 21, wherein shunting the signal propagating on the conductive path to a load includes transmitting the signal on the conductive path to a dissipating circuit, such as a resistive load so as to dissipate the signal on the conductive path as heat.

28. The non-transitory computer readable storage medium of claim 21, wherein transmitting the control signal to control the switch that upon receiving the control signal is configured to shunt the signal propagating on the conductive path to a load includes activating a MOSFET switch to conduct a trigger signal that is transmitted to the switch.

29. The computer readable storage medium of claim 21, wherein the device is further caused to generate a control signal to activate a filter situated on the conductive path if the determined average value of the signal exceeds the predetermined value.

30. The non-transitory computer readable storage medium of claim 29, wherein the filter is an LC circuit.

* * * * *